US012690461B2

(12) United States Patent　　　　(10) Patent No.:　US 12,690,461 B2
Yang et al.　　　　　　　　　　　(45) Date of Patent:　　Jul. 21, 2026

(54) STRESS-REDUCING DIELECTRIC-TO-METAL ADHESION ARCHITECTURE FOR ELECTRONIC PACKAGES

(71) Applicant: Intel Corporation, Santa Clara, CA (US)

(72) Inventors: Yi Yang, Gilbert, AZ (US); Srinivas Pietambaram, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 17/847,652

(22) Filed: Jun. 23, 2022

(65) Prior Publication Data

US 2023/0420389 A1　　　Dec. 28, 2023

(51) Int. Cl.
　　　*H10W 42/00*　　　(2026.01)
　　　*H10W 70/685*　　(2026.01)
　　　*H10W 70/69*　　　(2026.01)
　　　*H10W 90/00*　　　(2026.01)

(52) U.S. Cl.
　　　CPC ....... *H10W 42/121* (2026.01); *H10W 70/685* (2026.01); *H10W 70/69* (2026.01); *H10W 90/701* (2026.01)

(58) Field of Classification Search
　　　None
　　　See application file for complete search history.

(56) References Cited

U.S. PATENT DOCUMENTS

2013/0271929 A1　　10/2013　Malatkar et al.
2021/0257309 A1*　　8/2021　Pietambaram .... H01L 21/76832

OTHER PUBLICATIONS

Borroto, A., et al., "Growth kinetics and origin of residual stress of two-phase crystalline-amorphous nanostructured films" , J. Appl. Phys., 129, 145301 (2021).
Peng, F., et al., "Semi-Additive Process for Low Loss Build-Up Material in High Frequency Signal Transmission Substrates" , Materials Science, 2016.
Tien, C-L, et al., "Thermal expansion coefficient and thermomechanical properties of SiNx thin films prepared by plasma-enhanced chemical vapor deposition", Applied Optics, vol. 51, No. 30, Oct. 20, 2012.

* cited by examiner

*Primary Examiner* — Nicholas J Tobergte
(74) *Attorney, Agent, or Firm* — Essential Patents Group, LLP

(57)　　　　　ABSTRACT

An electronic device package comprises a conductive feature over a first surface of a package substrate, the conductive feature to couple to an integrated circuit die; a first dielectric layer on the conductive feature, the first dielectric layer having a first thickness and comprising silicon and nitrogen; a second dielectric layer over the first dielectric layer and having a second thickness different than the first thickness and comprising silicon and nitrogen; and a third dielectric layer over the second dielectric layer and comprising an organic material.

27 Claims, 9 Drawing Sheets

FIG. 1 <u>100</u>
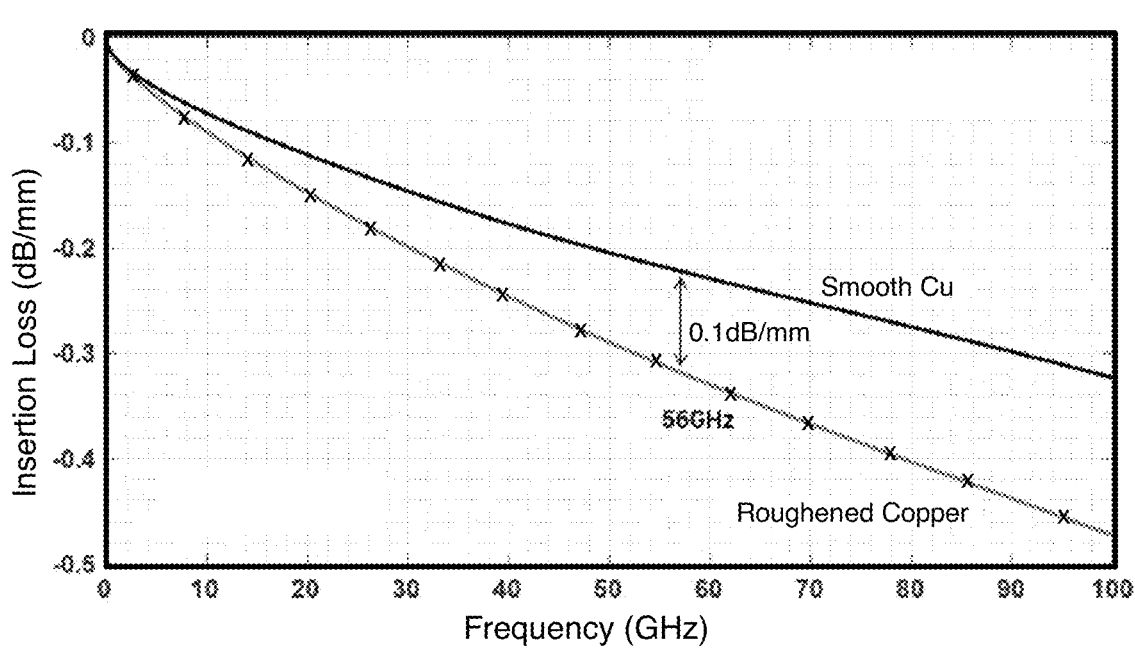
FIG. 2
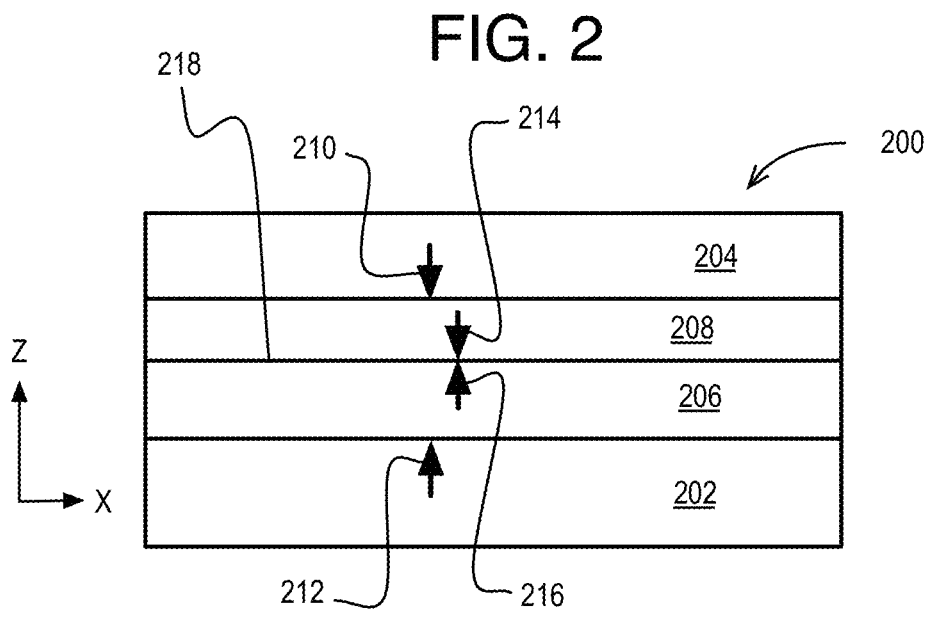

Figure 8:
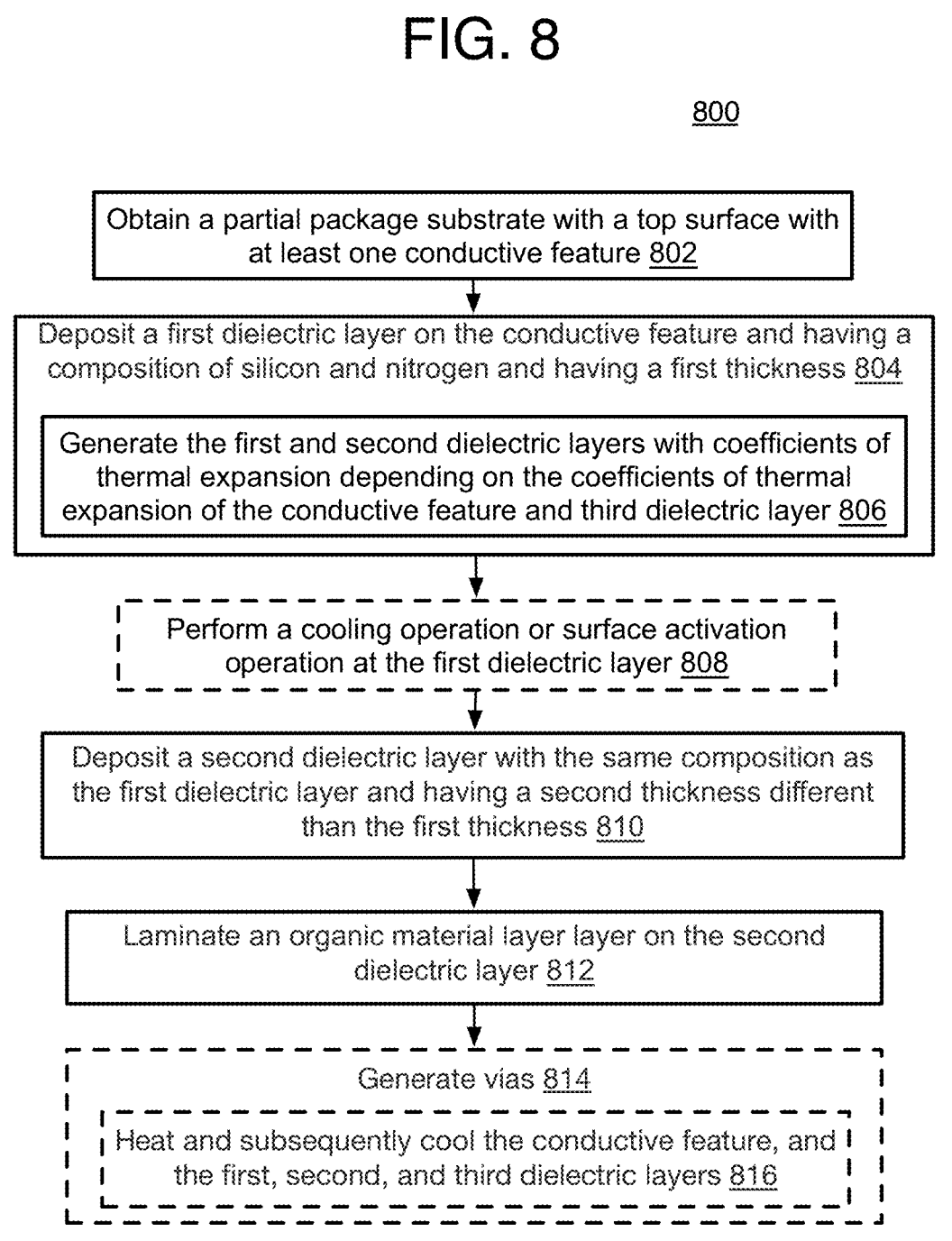

Obtain a partial package substrate with a top surface with at least one conductive feature 802

↓

Deposit a first dielectric layer on the conductive feature and having a composition of silicon and nitrogen and having a first thickness 804

Generate the first and second dielectric layers with coefficients of thermal expansion depending on the coefficients of thermal expansion of the conductive feature and third dielectric layer 806

↓

Perform a cooling operation or surface activation operation at the first dielectric layer 808

↓

Deposit a second dielectric layer with the same composition as the first dielectric layer and having a second thickness different than the first thickness 810

↓

Laminate an organic material layer layer on the second dielectric layer 812

↓

Generate vias 814

Heat and subsequently cool the conductive feature, and the first, second, and third dielectric layers 816

CAMERA 1803

PROCESSOR 1801

COMMUNICATION CHIP 1804

COMMUNICATION CHIP 1805

DRAM 1807

DRAM 1808

CHIPSET 1806

AMP 1809

GRAPHICS CPU 1812

ANTENNA 1816

ROM 1810

TOUCHSCREEN CONTROLLER 1811

GPS 1813

COMPASS 1814

MOTHERBOARD 1802

SPEAKER 1815

TOUCHSCREEN DISPLAY 1817

BATTERY 1818

POWER SUPPLY 1819

COMPUTING DEVICE 1800

STRESS-REDUCING DIELECTRIC-TO-METAL ADHESION ARCHITECTURE FOR ELECTRONIC PACKAGES

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like. These integrated circuit devices and packages generally include at least one integrated circuit die, such as a silicon die having integrated circuitry formed therein, that may be physically and electrically attached to an electronic substrate, such that conductive routes in the electronic substrate appropriately route electrical signals to and from the integrated circuitry of the integrated circuit device(s). The electronic substrates are formed of layers of dielectric material embedded with electrical conductors. Without some sort of adhesion treatment to maintain the electrical conductors tightly against the dielectric layers, delamination occurs such that damaging materials used for the manufacture of the substrates, such as lithography, etching, desmear, and/or drilling materials, often enters undesired spaces between the conductors and dielectric layers, thereby decreasing the performance of the substrate or even rendering it unusable.

The conventional adhesion techniques used with conductors of high speed data transfer can include the use of an adhesion layer between the electrical conductors and the dielectric layers that provide good chemical bonding between both the adhesion layer and the electrical conductors on one side of the adhesion layer, and the dielectric layer and adhesion layer on the other side of the adhesion layer. These layers, however, are typically placed in very high temperature environments while building vias on the layers. This can cause undesirable bending, cracking, and/or buckling of the layers due to the variation in coefficients of thermal expansion among the electrical conductors, the adhesion layer, and the dielectric layers, thereby resulting in unreliable, and sometimes unusable, electronic substrates.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 1 is a graph of insertion loss versus data signal transmission frequency for roughened conductive layers on electronic package substrates;

FIG. 2 is a schematic diagram of a cross-sectional view in an x-z plane of an example package substrate according to at least one of the implementations disclosed herein;

FIG. 8 is a flow chart of an example method of making a package substrate with stress-reducing dielectric-to-metal adhesion architecture according to at least one of the implementations of the disclosure;

DETAILED DESCRIPTION

Figures 3, 4, 5, 6:
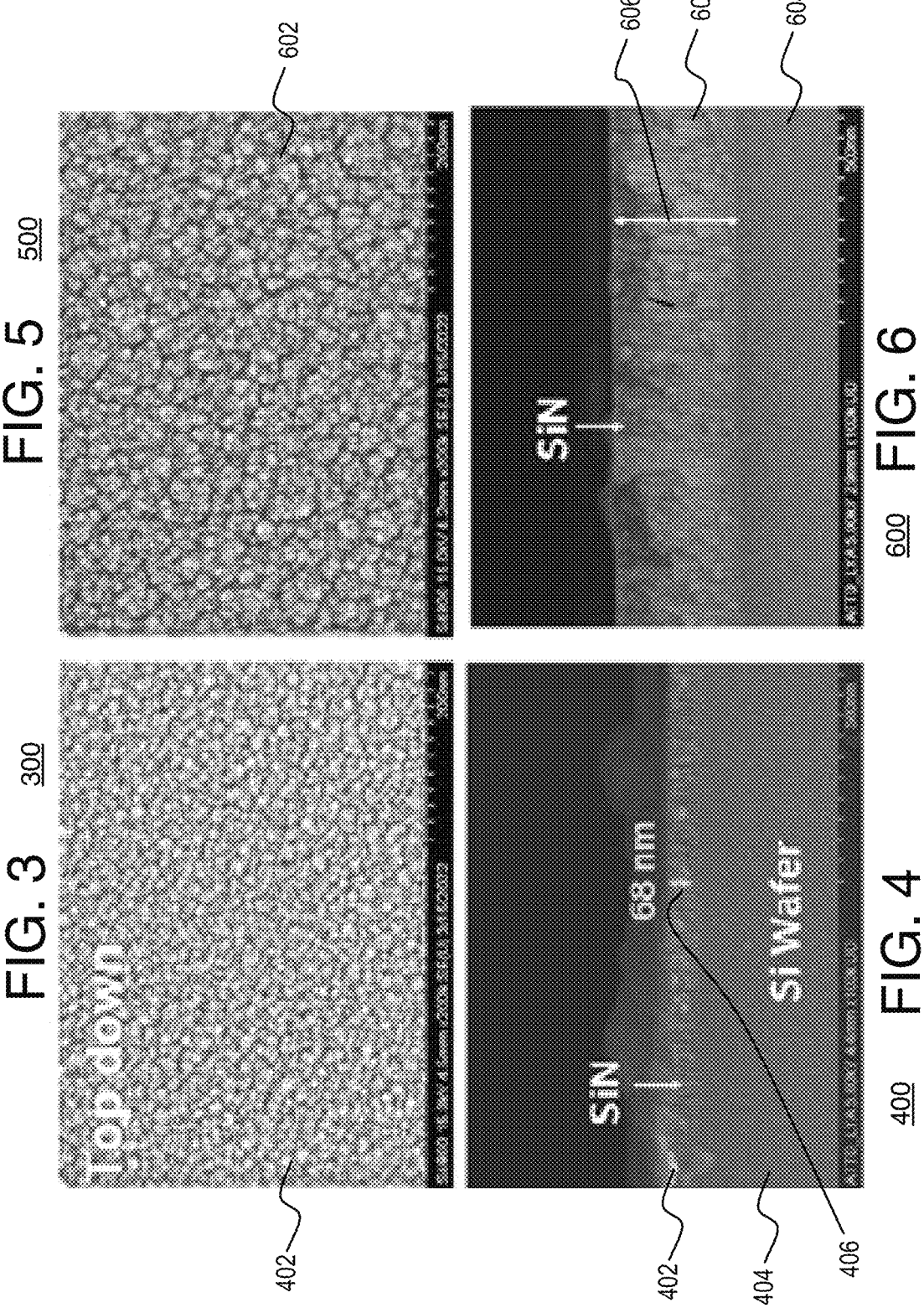
FIG. 3 is an image of a top view of an $SiN_x$ adhesion film with a small thickness.
FIG. 4 is an image of a cross-sectional side view of the adhesion film of FIG. 3.
FIG. 5 is an image of a top view of an $SiN_x$ adhesion film with a large thickness.
FIG. 6 is an image of a cross-sectional side view of the adhesion film of FIG. 5.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein also may be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized, and structural and/or logical changes may be made without departing from the scope of claimed subject matter. It should also be noted that directions and references, for example, up, down, top, bottom, over, under, and so on, may be used to facilitate the discussion of the drawings and implementations and are not intended to restrict the application of claimed subject matter. Therefore, the following detailed description is not to be taken in a limiting sense, and the scope of claimed subject matter is defined by the appended claims and their equivalents.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an implementation" or "one implementation" refers to a particular feature, structure, function, or characteristic described in connection with the implementation is included in at least one implementation of the present disclosure. Thus, the appearances of the phrase "in an implementation" or "in one implementation" in various places throughout this specification are not necessarily referring to the same implementation. Furthermore, the particular features, structures, functions, or characteristics may be combined in any suitable manner in one or more implementations. For example, a first implementation may be combined with a second implementation anywhere the particular features, structures, functions, or characteristics associated with the two implementations are not mutually exclusive.

As used in the detailed description and the appended claims, the singular forms "a", "an" and "the" are intended to include the plural forms as well, unless the context indicates otherwise. It also will be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact.

Herein, the term "conductive feature" may refer to any metal structure within a package substrate that is part of the extra-chip circuitry, and is generally embedded within the dielectric material of the package substrate. Structures include traces and pads that are within a metallization layer or plane (e.g., in-plane). Vias and their caps that interconnect in-plane conductive features within adjacent metallization levels are included as well. "Conductive features" may be substituted by simply "features" at times within the disclosure.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket may receive the microprocessor and couple it electrically to a printed circuit board (PCB).

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As the goals of the integrated circuit industry are achieved, package substrates require significantly higher speed and higher density input/output (IO) (HSIO) routing for traces and chip-to-chip interconnect technologies. In one example, higher speed input/output data transfer is an essential requirement in enabling the support for serializer/deserializer (SerDes) interconnects at 28 GHz or greater. As will be understood, such interconnects need to operate with high frequencies, while having low signal or insertion losses. Particularly, at high frequencies, a significant majority of signal transfer within an electrical conductor (e.g. electronic traces, interconnects, etc.) occurs close to the surface of the electrical conductor, which is known as the "skin effect". For example, at 1 MHz, the signal transfer occurs at about 66 microns from the surface of the electrical conductors. At 28 GHz, it reduces to about 400 nanometers from the surface of the conductor, at 100 GHz to about 200 nanometers, and at 200 GHz shrinks to about 150 nanometers.

In addition, the density of input output (IO) routing is increasing and is an integrated interaction between via size, number of conductor lines and spacing (or pitch) between lines (referred to as L/S), bump pitch, via-to-pad alignment, pad-to-via alignment, and material (e.g., resist and thin dielectric material) properties. For example, known 110 micron bump pitch gives less than 20 IO/mm/layer (49 micron diameter vias, 9/12 micron L/S, and 14 micron alignment). Very high IO density (>100 IO/mm/layer) often requires significant advancement in patterning, alignment and via formation capabilities. Current desirable IO density scaling is to reduce the routing pitch down to 2/2 micron L/S.

The conventional technique for adhering the conductor layers, with a material such as copper, to the dielectric layers, with a material such as an organic polymer and inorganic filler composite, is by mechanical adhesion techniques such as roughening the surface of the conductors which can gouge the conductor surfaces to depths of 200 nm or more. This often causes unacceptable insertion loss levels due to the skin effect and particularly with the high speed IO (HSIO) data signal conductors and reduced L/S of the conductors. The roughened surfaces cut through the skin depth of the high frequency signals forcing relatively significant diversions or disruptions of the signals transmitting through the conductors thereby causing the increased insertion loss.

Referring to FIG. 1 for example, a graph 100 shows that the difference in insertion loss becomes larger for roughened conductors as the signal frequency becomes greater and compared to smooth Cu conductors. The conductor here was roughened at 0.5 microns and a GY16B dielectric was used. At a typical high frequency of 56 GHz, the roughened conductor had 0.1 dB/mm more insertion loss than the smooth conductor (as shown from −0.22 dB/mm to −0.32 dB/MM), which is a significant difference that can reduce the reliability of an electronic package. Thus, these high speed conductors should have very smooth surfaces instead.

Attempts to provide a solution to maintaining smooth conductors include the use of chemical adhesion techniques. This includes depositing an adhesion layer over the conductors and under a dielectric or lamination layer to better adhere the conductor to the dielectric layer without roughening the conductor. Thereafter, the fabrication may include laser drilling through the dielectric and adhesion layer to form via holes, a desmear cleaning process applied to clean the hole, and then depositing of the vias. The laser drilling may heat the layers up to 500-600K, while subsequent curing operations for certain layers may re-heat layers to 170-200K. Because heat dissipation through the conductor is usually limited, this causes thermal forces to be distributed throughout the conductor, adhesion, and dielectric layers causing the layers to expand during heating and then contract during a subsequent cooling. Since these layers all have different coefficients of thermal expansion (CTEs), this can result in bending (or warping), cracking, and/or buckling of the layers, resulting in separation of the adhesion layer from the conductor or dielectric causing delamination, and in turn, unreliable or unusable substrates when damaging fabrication materials are able to occupy an open area between the dielectric layer and the conductor.

Since a single adhesion layer is a homogeneous material, the adhesion layer expands and contracts due to thermal force of any significance according to a single CTE value of the layer so that the CTE of the single adhesion layer will always have a discrepancy from the CTE of either the conductor or dielectric layer when these two layers do not have the same CTE. Thus, no adequate single adhesion layer solution exists that has a controlled variation of CTE from one surface to another surface of the adhesion layer.

Some attempts at reducing the thermal-based deformations include a high stress-absorbing conventional single adhesion or buffer layer formed of a polymer material such as polyimide and placed between the conductor and the lamination dielectric layer to at least absorb and cancel out some of the thermal forces from both the conductor and dielectric layer. Such adhesion layer, however, often has a high elongation flexibility (or is very stretchable) typically indicated by a low modulus of elasticity, a relatively high glass liquid transition temperature (e.g., 200° C.-380° C.), and a relatively high coefficient of thermal expansion (CTE) such as over 30 ppm/K that also indicates a material that easily absorbs the thermal forces from the surrounding layers. This polymer-based buffer/adhesion layer, however, typically is too weak to provide sufficient mechanical strength and stability for substrate reliability such as to support a stack of substrate layers for example. Thus, it is extremely difficult to balance the trade-off between CTE (i.e., stress reduction) on the one hand and the modulus (or the strength of the material) on the other. The known polymer adhesion layers do not provided the correct balance yet Alternatively, an annealing operation may be used on the stack of layers including an adhesion layer between a conductor and a dielectric layer. Such a high temperature environment can enable or accelerate structural rearrangement of materials of the layers into thermodynamically favorable conformations, and increase the entropy contraction (e.g., shrinking) force. As a result, a crystalline framework or extended chains on the conductor contract and reduce or relax thermal-based stresses. The annealing operation, however, is typically limited by a maximum temperature requirement for the substrate, i.e., approximately 250°

C. to 300° C. While the annealing temperature of a Cu conductor can range from 150° C. to 450° C., high annealing temperatures still cause degradation or deformation of organic layers, cores, and other dielectric interfaces with the conductor resulting in delamination or cracks induced by the CTE mismatch between different metal and dielectric layers anyway.

To resolve these issues, a multi-layer stress-relieving adhesion stack may be placed between a conductor and a dielectric layer to provide good adhesion at conductor-dielectric interfaces while also facilitating the relaxation of thermal-based stress. This arrangement reduces delamination and dielectric cracking, and increases the reliability of the package substrate and in turn its IC package. By one particular form, a multi-layer thin film structure can provide good adhesion to the conductor-dielectric interface while providing for adjustable CTE control to equalize thermal-based compression forces (or tension forces) so that opposite thermal-based forces from the dielectric layer and conductor will cancel each other.

For example, during heating of the substrate layers, such as when via passages are being laser drilled through the layers, the conductor and dielectric layer will expand according to their respective coefficients of thermal expansion. This will press a compression force or stress against both the top and bottom surfaces of the adhesion layers between the conductor and dielectric layer. Similarly during cooling after the laser drilling, the conductor and dielectric layer will be in tension, and the conductor and dielectric layer will pull the intermediate adhesions layers away from each other. These opposite forces, whether compression from heating or tension from cooling, can be equalized by using the two or more adhesion layers with specific coefficients of thermal expansion. The CTEs of the adhesion layers generally indicate how much stress can be absorbed by those adhesion layers and in turn how much stress will be passed through an adhesion layer to a next adjacent layer.

Referring to FIG. 2 for example, a package substrate 200 is shown with a conductive feature (or conductor or conductive layer) 202. The conductive feature 202 may be on over a surface of a the package substrate 200, and may be arranged to couple to an integrated circuit as described herein. Package substrate 200 also may have a lamination or dielectric layer 204 of an organic material and to be adhered to the conductive feature 202. In this example, a first dielectric adhesion layer 206 is over or on the conductive feature 202 and a second dielectric adhesion layer 208 is over or on the adhesion layer 206 while being under the dielectric layer 204. In this dual layer adhesion example, only the two adhesion layers 206 and 208 are present and in contact with each other, although more layers could be used as explained below.

In this example, the conductive feature 202 has a CTE of 17 ppm/K and exerts a compression force 212 on the adhesion layer 206 when heated. The dielectric layer 204 has a CTE of 20 ppm/K and exerts a compression force 210 on the adhesion layer 208 when heated. The adhesion layers can be arranged to have specific CTEs so that forces 214 and 216 exerted on opposite sides of a surface 218 of one of the adhesion layers and that is contacting the opposite adhesion layer are equal and are absorbed by the adhesion layers 206 and 208 so that the forces 214 and 216 cancel each other so that the resulting compression force is at or near zero at the surface 218 between the adhesion layers 206 and 208. It will be understood that the cancellation of the forces is the same when the forces are tensile forces during cooling rather than compression during heating. Also, while the forces 210, 212,

214, and 216 are shown as single point forces, it will be understood that this is merely a representation of the forces, and the forces (or stresses) actually may be exerted continuously or intermittently along the surfaces between the layers and whether as a uniform force or with some variation in the amount of force amount. Thus, the forces 210, 212, 214, and 216 may be an average force or some other combination or representative force over a surface of the layers.

Continuing the example here, say the CTE of adhesion layer 206 is set at 3 ppm/K and the CTE of the adhesion layer 208 is set at 6 ppm/K by performing deposition of the dielectric materials for the adhesion layers with the parameters discussed below. The CTE generally indicates or is proportional to the amount of stress the layer can absorb. Thus, the stress represented by the resulting CTE from the conductor side is 17 (the CTE of the conductive feature 202)–3 (the CTE of the adhesion layer 206 in contact with the conductive feature 202)=14 ppm/K represented by stress or force arrow 216. Likewise, the resulting CTE from the dielectric side is 20 (CTE of the dielectric layer 204)–6 (the CTE of the adhesion layer 208 in contact with the dielectric layer 204)=14 ppm/K represented by stress or force arrow 214. Thus, the now equal and opposite compression (or tension) forces 214 and 216 from the dielectric layer 204 and conductive feature 202 generally at surface 218 cancel each other (although the precise location of the cancellation could be different). As a result, the thermal-based forces will insignificantly impact the layers eliminating or substantially reducing the risk of warping, cracking, buckling, or otherwise deforming the layers due to the thermal forces.

Thus, the difference in CTEs between the dielectric layer and conductive feature can be compensated for by setting the CTEs of the multiple adhesion layers between the dielectric layer and conductive feature to absorb the stress generated by the difference in CTE and to equalize those forces. To achieve this, a number of algorithmic relationships should be followed. Thus for example, the difference of CTEs between the conductive feature and dielectric layer should be the same as the difference in CTEs between the two adhesion layers. Thus, in this example mentioned above then, the CTE values result in (20–17)=(6–3). Also, it follows then that the difference in CTE between the conductive feature and the adhesion layer next to the conductive feature (17–3)=14 is the same as the difference in CTE between the dielectric layer and the adhesion layer next to the dielectric layer (20–6)=14. In addition, the smaller CTE of the two adhesion layers should be adjacent which either of the conductive feature and the dielectric layer that has the smaller CTE. When both adhesion layers 206 and 208 have CTEs lower than the CTEs of the conductive feature 202 and the lamination layer 204, in this case then, the two adhesion layers are much more rigid than the conductive feature and dielectric layer as evidenced by the much lower CTEs relative to that of the dielectric layer and conductive feature. By one form when using two adhesion layers, this need not always be the case as long as the adhesion layers have CTEs both larger or both smaller than that of the dielectric layer and conductive feature.

The adhesion layers can be arranged to have a specific CTE by controlling deposition parameters including the composition, morphology (or microstructure), density, and thickness of the adhesion layers. For example, $SiN_x$ has shown good performance as an adhesion material between Cu conductive features and a lamination dielectric layer. It has been found that the CTE (or intrinsic stress) of sputtered $SiN_x$ can be tuned by controlling the process conditions and film thickness. The larger the $SiN_x$ film thickness, the larger the nanocolumnar feature size. The taller the nanocolumnar height, the more (relatively) rigid the adhesion layer will be and the smaller the layer's CTE. The thinner the layer, the less rigid and the higher the CTE.

Referring to FIGS. 3-4 for example, a test case is shown in a top view image 300 and a cross-sectional side view image 400 of an $SiN_x$ adhesion layer 402 on a Si wafer 404 and having a thickness 406 of about 60-70 (here 68) nm. The adhesion layer 402 has reactively sputtered $SiN_x$ film microstructure (or morphology). Image 300 shows relatively small columnar grain growths. Referring to FIGS. 5-6, a top view image 500 and a cross-sectional side view image 600 shows an $SiN_x$ adhesion layer 602 on a Si wafer 604 substrate and with a thickness 606 of about 300 nm. As thicker adhesion layers were constructed, it was found that the CTE of the layer was smaller.

Figure 7:
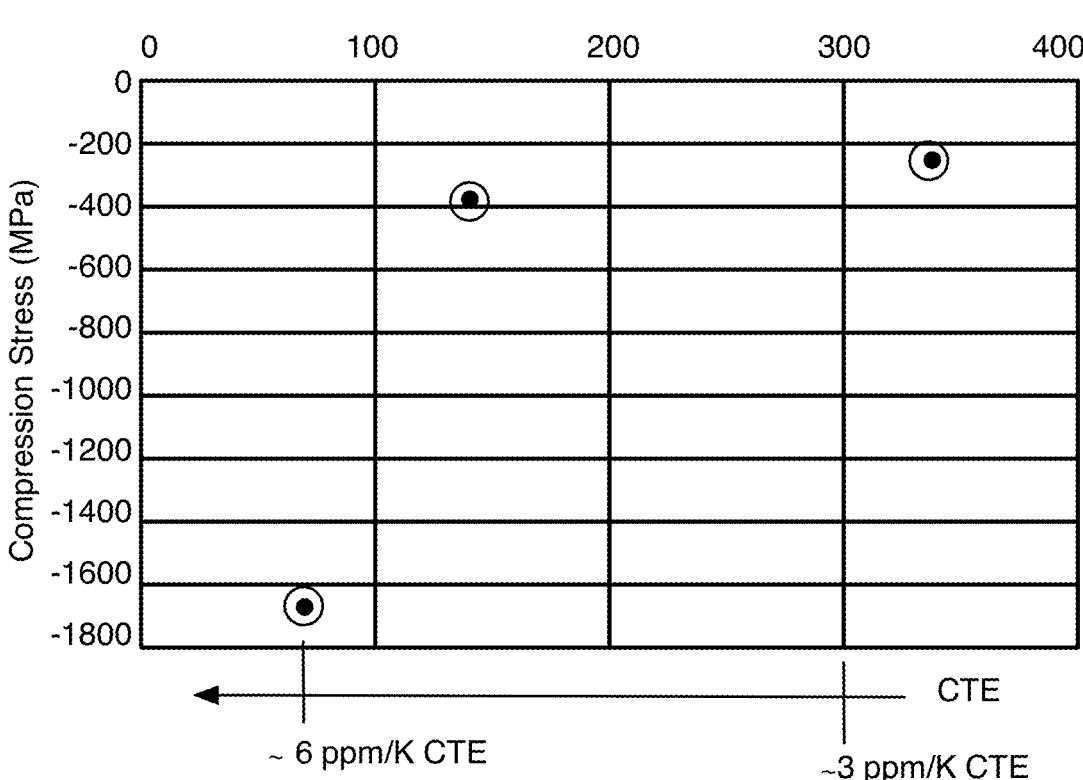
FIG. 7 is a graph of stress versus $SiN_x$ adhesion film thickness.

Referring to FIG. 7 specifically, the correspondence between $SiN_x$ film compressive stress on an Si wafer with film thickness is shown on a graph 700. Particularly, the graph 700 shows residual or internal compression stress of $SiN_x$ (in MPa) as a function of the film thickness in nanometers. The CTE of the $SiN_x$ adhesion layer can be tuned by changing the deposition time during reactive sputtering deposition. The compressive stress of an $SiN_x$ film on an Si wafer substrate decreases gradually (moves up toward zero here since compressive force is treated as a negative) with increased film thickness, and thereby indicates the corresponding CTE of $SiN_x$ decreases with the increased film thickness. The CTE of the $SiN_x$ may be computed as approximately 2 to 6 ppm/K using known equations. Thus, the $SiN_x$ film microstructure of an adhesion layer can be tuned to achieve a target CTE value or intrinsic stress simply by changing deposition conditions such as duration or otherwise a total amount of deposition.

Referring again to FIG. 2 for this example, a first dielectric or adhesion layer 206 on the conductive feature 202 may have a first thickness and may comprise silicon and nitrogen. A second dielectric or adhesion layer 208 over the first adhesion layer 206 may have a second thickness different than the first thickness and may also comprise silicon and nitrogen. A third dielectric layer 204 over the second adhesion layer 208 comprises an organic material. This thicknesses of the adhesion layers 206 and 208 can be set to control the CTEs of the layers. Thus, the first adhesion layer 206 may have a thickness of 250-350 nm, and in one example about 300 nm, to set a CTE of 3 ppm/K, while the second adhesion layer 208 may have a thickness of about 50-70 nm, and in one example 60 nm to set a CTE of 6 ppm/K to cancel the equalized forces 214 and 216 as explained above. By this example form, the compositions of the adhesion layers 206 and 208 is the same, and may be set at $SiN_{0.8}$ with an amorphous nanocolumnar microstructure and a density that requires 100 A/min of wet etch rate.

It will be appreciated that while a composition of $SiN_x$ for a thin film adhesion layer with tunable properties is described herein as one example, other compositions and other properties could be used to tune the CTE as well. Thus, rather than, or in addition to, varying the thickness from one adhesion layer to another to tune the CTEs, other properties could be varied including the composition, density, and/or chemical microstructure (morphology) of the adhesion layers.

By one form to tune CTEs in the adhesion layers, variations in $SiN_x$ where x varies from one adhesion layer to another adhesion layer may be used. By other forms, other Si compositions may be used from one adhesion layer to another adhesion layer including another composition with silicon and nitride such as $SiO_xN_y$, other silicon compositions such as $SiO_2$, or different non-Si compositions could be used as well such as TiN.

By another form to tune CTEs, microstructure may be varied from adhesion layer to adhesion layer where one layer is amorphous based and nanocolumnar above the base, while another layer may have crystalline structure, for example. By one example, one adhesion layer maybe substantially amorphous while the other adhesion layer may be substantially crystalline. Otherwise, specific crystalline heights may be different on the two layers. As mentioned, the CTE changes depending on the crystalline height. Also as mentioned, the grain size may indicate the crystalline height, and in turn layer thickness, so that the average grain size should be larger on the thicker layer than that on the thinner layer. Average grain size may be determined from the largest grain size at each column, by one example.

By yet another way to tune the CTEs, the density of the adhesion layer may be varied. Density may be measured by external fabrication operations that vary depending on density, such as a wet etch rate. For example, a density may cause a wet etch operation to achieve a wet etch rate of 100 A/min while another adhesion layer may have a density that causes a wet etch rate of 1000 A/min. The higher the density, the lower the CTE.

This approach can provide strong adhesion of smooth conductors, such as copper traces or pads, to dielectric for HSIO or other high frequency routing while eliminating or reducing deformation due to thermal-based forces. The CTE tuning of the adhesion layers thereby provides great flexibility in the arrangements or architecture of such substrates. Thus, a package substrate for IC packages is described herein with substrate metallization under a lamination or dielectric layer with multiple stress-reducing adhesion layers between the metallization and the dielectric layer. The metallization includes at least some conductive features 202 that remain relatively smooth that do not need to be roughened.

In this disclosure, HSIO features such as HSIO traces may be entirely dedicated to high-speed signal conduction, therefore requiring smooth surfaces to reduce losses that may compromise signal quality, or may be used to carry non-HSIO signals as well. Non-HSIO features, however, cannot carry HSIO signals, and may conduct lower speed I/O signals or be employed in power routing. In some implementations, non-HSIO features may be part of the HSIO signal routing as through-layer vias and pads for vertical interconnection of HSIO traces. Nonetheless, non-HSIO conductive features also may be covered by multiple adhesion layers rather than being roughened as well when found desirable or efficient to do so. Thus, conductive features 202 may be HSIO conductors (such as with 50 micron width traces) that carry HSIO or non-HSIO signals, or the conductors may be non-HSIO conductive features that are covered by the multiple adhesion layers anyway.

It should be noted that in one alternative form, the multiple stress-relieving layers between the conductive feature and lamination layer could be provided for reasons other than adhesion and instead of adhesion, or in addition to adhesion, or only for stress relief instead.

Referring to FIG. 8, an example process 800 provides for making an electronic package substrate with multiple dielectric adhesion layers between conductive features and the covering dielectric or lamination layers according to at least one of the implementations herein. Process 800 may include operations 802 to 816, numbered evenly.

Process 800 may include "obtain a partial package substrate with a top surface with at least one conductive feature" 802. Here, a partial package substrate is received and prepared for fabrication of multiple adhesion layers before a lamination layer is placed above the stack of adhesion layers. In this example, the substrate may have a center board, middle layers, or core where the layers are stacked above the core. The as-received package substrate may comprise a top-level metallization plane on the surface of a substrate dielectric material that has been plated (e.g., by galvanic electroplating or by electroless deposition) in a previous operation. In some implementations, the package substrate may be fabricated in a build-up process (e.g., a bumpless build-up layer (BBUL) package), whereby the package is formed by build-up of individual levels that each level may have a dielectric film and a metallization plane integral with the dielectric film.

In more detail, metallization planes may comprise conductive features fabricated from electrodeposited copper (a semi-additive process) or etched (a subtractive process) through a lithographically defined photoresist mask. New layers may be added to one or both sides of dielectrics on a core and by a build-up package in cycles of dielectric film lamination and formation of a new metallization plane over the laminated dielectric film. The dielectric materials may comprise organic and ceramic dielectric materials. In some implementations, all of the conductive features herein comprise copper or an alloy of copper, although other conductive metals or metal alloys could be used.

As mentioned above, conductive features may be divided into high-speed I/O (HSIO) conductive features and non-HSIO conductive features that do not conduct high-speed signals, and therefore are not sensitive to surface roughness. In general, non-HSIO features are larger than HSIO features, and non-HSIO traces may not be as long as HSIO traces. Also, it is understood that vias described in this disclosure, including vias associated with HSIO traces and pads, are typically non-HSIO features but could be HSIO features as well. HSIO conductive features may include I/O traces exhibiting a smooth surface finish that is to be maintained without intentional roughening on the substrate, while non-HSIO conductive features on the substrate may either be covered by multiple adhesion layers as described here or may include structures having a greater surface roughness when deemed more efficient or otherwise more desirable. Included in this category may be pads that are integral with vias, known as landing pads or via pads. It is noted that throughout the disclosure, average surface roughness also may be referred to as the surface finish.

By one form, conductive features (e.g., traces) may be formed by semi-additive electroplating copper over dielectric to thicknesses up to 40 microns, and by one form from 10 to 40 microns. Semi-additive electroplating processes may include plating through lithographically-defined openings in a photoresist mask. In multilevel package substrates, HSIO traces also may be vertically interconnected to higher or lower conductor planes and to high-speed circuitry in an attached IC chip such as a microprocessor by small diameter vias.

Process 800 may include "deposit a first dielectric layer on the conductive feature and having a composition of silicon and nitrogen and having a first thickness" 804. This is a first stage in a dual-deposition process being explained here, although more than two depositions may be used as described below. For this first deposition stage, a permanent dielectric adhesion layer or thin interfacial layer or film may be deposited on one or more of the conductive features. This first adhesion layer may be deposited by physical vapor deposition (PVD), chemical vapor deposition (CVD), atomic vapor deposition (AVD), and/or molecular vapor deposition (MVD), and so forth. By one form, the deposition process of the adhesion layer or film can be, but not limited to, sputtering or plasma-based thin film deposition, which undergoes relatively low temperature (less than 100° C.) sputtering operations, and therefore, less risk for temperature-sensitive substrate packing and less thermal deformations for the metal-dielectric stack up at least during the deposition of the dielectric adhesion layer.

By one form, the adhesion or first dielectric material is deposited or coated on the entire top surface of the substrate including over the conductive features in a blanket deposition. By alternative approaches, photosensitive layers, masks, and lithography could be used to place the adhesion layer(s) only on desired areas of the substrate such as just over one, all, or certain ones of the conductive features or parts of the conductive features. For example, when selective roughening is used, the adhesion layer may be placed on a top surface of the conductive feature and the sidewalls of the conductive feature may be left exposed for roughening or vice-versa. This also may include having the adhesion layer be conformal to at least the side edges of the conductive feature when a middle of the conductive feature will be exposed for via attachment for example.

To achieve the cancellation of thermal-based stress as described herein, this operation also may include "generate the first and second dielectric layers with coefficients of thermal expansion depending on the coefficients of thermal expansion of the conductive feature and third dielectric layer" 806. This is as explained above, where the material to be deposited has a specific composition, microstructure, and/or density as set with deposition parameters by known semiconductor layer deposition devices such as with sputtering. When the deposition rate is fixed, a deposition duration may be set to deposit dielectric material to a desired thickness as mentioned above to provide a certain CTE, where the thicker the $SiN_x$ layer for example, the lower the CTE. By one form, the CTE may be computed by common non-free-standing thin film CTE equations such as by one example:

$$\sigma_{th}=(\alpha_s-\alpha_f)B_f(T_2-T_1) \qquad (1)$$

where $\alpha_s$ is the CTE of the substrate. The CTE is $2.60\times10^{-6°}$ $C.^{-1}$ for an Si wafer and $3.76\times10^{-6°}$ $C.^{-1}$ for Corning glass for example. $\alpha_f$ is the thermal expansion coefficient of the thin film, which can be determined by a double-substrate method; $B_f$ is the biaxial modulus of the thin film and is defined as $B_f=E_f/(1-v_f)t$ where $E_f$ is Young's modulus, and of is Poisson's ratio, and $T_1$ and $T_2$ from equation (1) are the temperatures before and after heating, respectively.

In the example of substrate 200 (FIG. 2) where the conductive feature 202 has a lower CTE than the CTE of the dielectric layer, the deposition duration to form the first or lower adhesion layer 206 directly on the conductive feature 202 will be longer than the deposition duration for the second or upper adhesion layer 208. Thus, the first adhesion layer 206 is thicker and has a smaller CTE than a relatively thinner adhesion layer 208 with a higher CTE being deposited in the second deposition stage.

Also as mentioned above, the first dielectric or adhesion layer may have a $SiN_x$ dielectric material as described above. In this case, the $SiN_x$ may be provided with enhancements in certain variations including with a catalyst of palladium, phosphorous, boron, tetrakis (triphenylphosphine) palladium (Pd(PPh$_3$)$_4$, and/or with a plasma application that enhances chemical bonding with oxygen or nitrogen containing ligands. Also as mentioned, other compositions could be used such as different $SiN_x$ molecule structures, different Si-based compositions as mentioned above, or other non-Si compositions, i.e. TiN.

Optionally, process 800 may include "perform a cooling operation or surface activation operation at the first dielectric layer" 808. Here, the first dielectric layer may be cooled before a second dielectric adhesion layer is deposited on the first adhesion layer. Otherwise, surface activation may be performed on the first adhesion layer, such as a plasma treatment to provide the surface of the first adhesion layer with desirable properties, such as increasing certain chemical group concentrations for easier bond development, and so forth. Such operations show that the first and second dielectric or adhesion layers are at least initially separate since they are separately deposited (at different times). However, the cooling and surface activation operations need not always be present, and one layer could be deposited directly after the other layer. Any interruption or operation in deposition processes that form two separate layers that can have two different CTEs will suffice to define or form separate adhesion layers.

Thus, thereafter, process 800 may include "deposit a second dielectric layer with the same composition as the first dielectric layer and having a second thickness different than the first thickness" 810, and to perform the second stage of the dual-deposition process. Here the deposition operations are the same as mentioned above with the first stage except for the parameter variations to control the CTE of the second dielectric layer. In the example of the construction of the substrate 200, the deposition of the dielectric or adhesion material is shorter than that used with the first dielectric layer 206 to form a thinner second adhesion or dielectric layer 208 here with a larger CTE. Also as mentioned, rather than, or in addition to, changing the thickness of the dielectric material, the composition, microstructure, and/or density of the layer may be changed compared to the first dielectric layer to tune the CTE value, and with the variations already mentioned above with substrate 200.

Next, process 800 may include "laminate an organic material layer on the second dielectric layer" 812 In this operation, a dielectric lamination layer may be placed over the second or upper adhesion layer. This may be an organic layer of a molded resin (e.g., an epoxy resin), ceramic composite, composite organic films consisting of silica fillers embedded in an organic polymer, a film polymer resin with a polyethylene terephthalate (PET) support film, resin layer, and a cover film, liquid crystal polymer, bismaleimide triazine resin, glass-reinforced epoxy laminate material frame retardant-4 (FR4), polyimide materials, and the like. This lamination layer then may protect the adhesion layers and the smooth conductive features.

Process 800 may include "generate vias" 814 where the vias may be placed through the first, second, and/or third dielectric layers and to the first and second conductive layers. After the multiple adhesion layers and the lamination layer are deposited, via holes may be drilled through the layers to expose the conductive features for mounting of vias onto the conductive features. The holes may be formed by using laser drilling that generates heat at the layers on the substrate. Consequently, this operation may include "heat and subsequently cool the conductive feature, and the first, second, and third dielectric layers" 816. The heating and cooling will cause the thermal expansion and contraction of the layers as discussed above. Since the adhesion layers are constructed according to the parameters described above with tuned CTEs, the thermal forces will equalize and apply the same stress or force on a surface of one of the adhesion layers that faces the other adhesion layer so that the stresses cancel out, thereby eliminating or reducing deformation of the layers.

Thereafter, a wet and/or dry desmear cleaning can then be applied to clean debris from the holes. Next, the holes may be filled to form the vias. The vias may be formed by electrodeposition (e.g., galvanic or electroless deposition) copper or a suitable alloy of copper into openings (not shown). This operation may include forming pads or caps on the distal ends of the vias. The entire construct can now proceed towards the usual copper seeding, lithography, and copper plating semi-additive process (SAP) operations to construct further external vias and complete conductive routing on the substrate.

Figure 15:
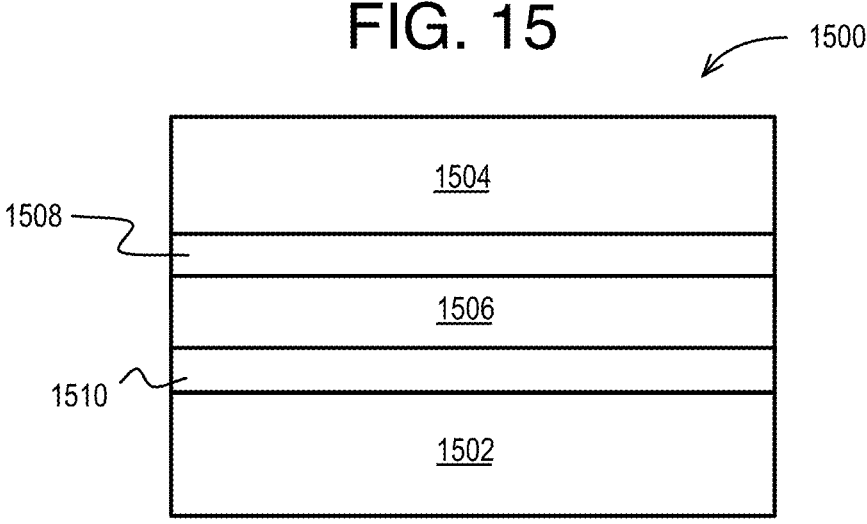
FIG. 15 is a schematic diagram of a cross-sectional side view in the x-z plane of an alternative example package substrate according to at least one of the implementations of the disclosure.
Figure 16:
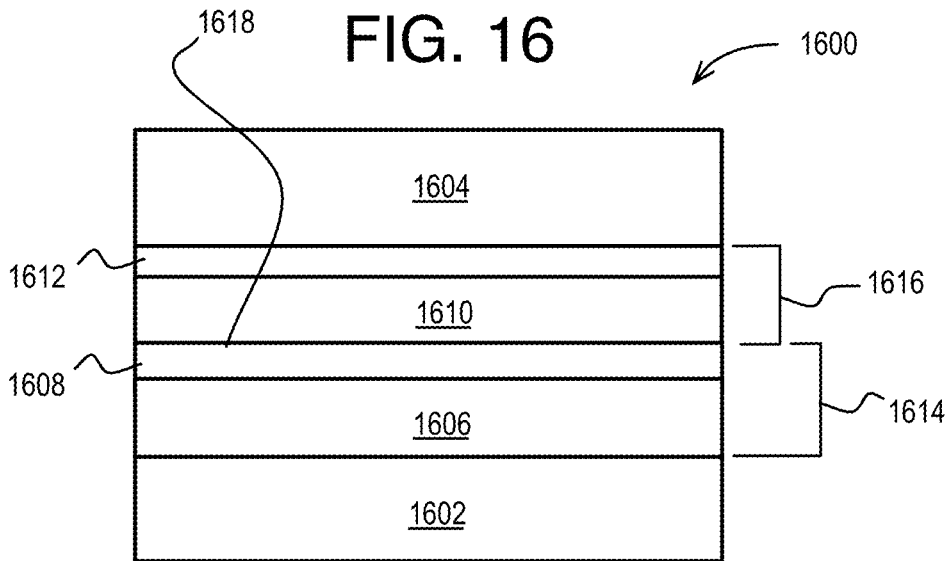
FIG. 16 is a schematic diagram of a cross-sectional side view in the x-z plane of yet another alternative example package substrate according to at least one of the implementations of the disclosure.

It will be appreciated that by one alternative, the deposition operation may be repeated for more than two adhesion dielectric layers as described below with substrate 1500 and 1600 (FIGS. 15-16). Thus, an extra adhesion layer may be added that is provided to increase adhesion between certain layers, and/or one or two stacks of stress-relieving CTE-tuned adhesion layers may be provided where each stack of adhesion layers is provided to absorb and equalize stress from the conductive feature and the lamination dielectric layer. The details are provided below.

Referring to FIGS. 9-14, a multi-layer adhesion architecture leverages the dual-deposition process capabilities with $SiN_x$ deposition. Intermediate electronic assemblies (or partial package substrates) show the application of process 800 used for the fabrication of a completed package substrate 1400 (FIG. 14) according to some implementations of the disclosure. All partial substrates in FIGS. 9-14 are shown in x-z axis cross-sections. Many components of the substrates in FIGS. 9-14 are the same and are therefore numbered the same and only described once when the component is introduced.

Figure 9:
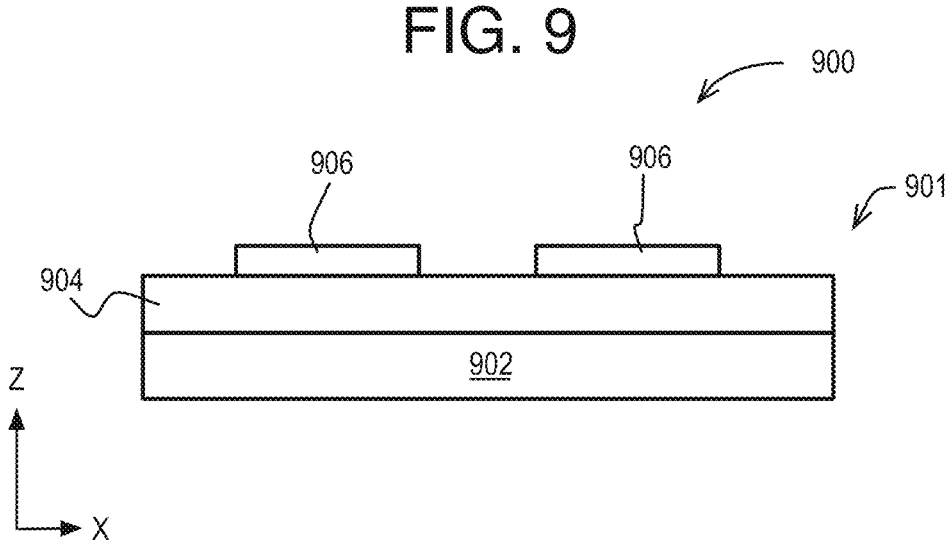
FIGS. 9-14 are schematic diagrams of cross-sectional views in an x-z plane of an example partial package substrates of a package substrate being constructed according to at least one of the implementations disclosed herein.

Referring to FIG. 9, a partial package substrate 900 may be formed by a cored or coreless build-up layer process, as mentioned above, whereby dielectric material is deposited or laminated one layer at a time. The dielectric material may include organic film laminates or liquid resins (including ceramic composites) that may be molded into individual layers. An electroplated metallization plane may be formed over each dielectric layer, after which another dielectric layer is added over the metallization plane. The lamination dielectric layer thickness may range between 10 and 100 microns by one example. The metallization planes or layers may comprise copper having a thickness (height) under 40 microns, or otherwise ranging between 5 and 40 microns and may be formed by semi-additive electrodeposition (e.g., of copper).

Particularly, partial package substrate 900 may have a core, bottom or center board, base or middle layer, or other such base structure or layer 902. The build-up on the base layer 902 may be in one direction with a single stack, or may be in two opposite directions where the base layer 902 is a center board, and the substrate has a top layer on both a frontside and a backside of the substrate. Layer stacking of a single stack is shown on the substrate 900 here. In either case, the base layer 902 itself may be formed of one or more dielectric layers as mentioned, metal layers, or a combination of both. A first dielectric layer 904 provides support for conductive features and may be the same materials as mentioned for the lamination dielectric layers herein. A metallization layer with conductive features 906, such as HSIO traces or pads, may be formed on the dielectric layer 904 and are to be maintained in a relatively smooth condition such as having an average roughness that is less than 200 nm or even less than 100 nm by some examples.

By one form, the conductive features 906 each may be traces at most 50 microns wide with thicknesses (heights) ranging between 10 to 50 microns, and may have a 2/2 micron to 9/12 micron L/S layout. By an alternative, the conductive features 906 also may include non-HSIO conductive features and that are to be covered by the adhesion layers rather than being roughened, or are to be roughened next to the covered smooth conductors.

Figure 10:
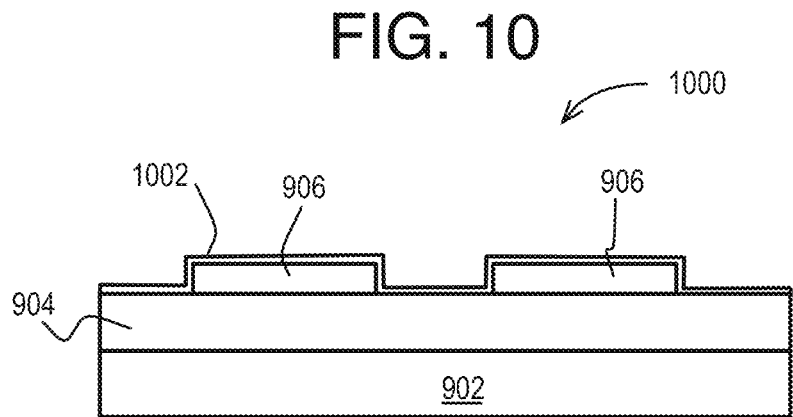

Referring to FIG. 10, a first stress-relieving dielectric adhesion layer (or film or just dielectric material) 1002 is deposited to form a partial substrate 1000, and by blanket deposition in this example. The first adhesion layer 1002 may be deposited on, or in contact with, the conductive features 906 and may be conformal to the shape of the conductive features 906. In this case, the first adhesion layer 1002 is adjacent both a top surface and sidewalls of the conductive features 906, and atop the dielectric layer 904 between the conductive features 906. The adhesion layer 1002 may be a permanent layer directly covering the conductive features 906. The adhesion layer 1002 may be engineered to provide better adhesion between a dielectric layer 1202 (FIG. 12) and the conductive features 906 to prevent or reduce delamination of the lamination layer 1202 from the conductive features 906. By one form, the adhesion layer 1002 is a thin film, and has the properties as described above to have a molecular structure with a desired CTE. By one example form, the first adhesion layer 1002 here has the same properties as the first adhesion layer including being an $SiN_x$ layer with a thickness of 250-350 nm, or here 300 nm, and a CTE of 3 ppm/K, although other variations in thickness, composition, morphology, and density as discussed herein could be used instead, and as described above with operations 804 and 806.

The adhesion layer 1002 also may be a protective layer to assist in protecting the conductive features 906, and particularly the smooth surfaces of the HSIO conductive features. The adhesion layer 1002 also may assist with a dielectric environment that may be more advantageous than that provided by package dielectric layer 1202 alone. As an example, the permittivity (e.g., dielectric constant) of adhesion layer 1002 may be smaller than the permittivity of package dielectric 1202, reducing capacitive coupling between adjacent traces.

As an alternative to the blanket deposition, the adhesion layer 1002 may be patterned when only certain areas of the substrate 1000 are to be covered such as to uncover dielectric layer 904 or other non-conductive structures.

Figure 11:
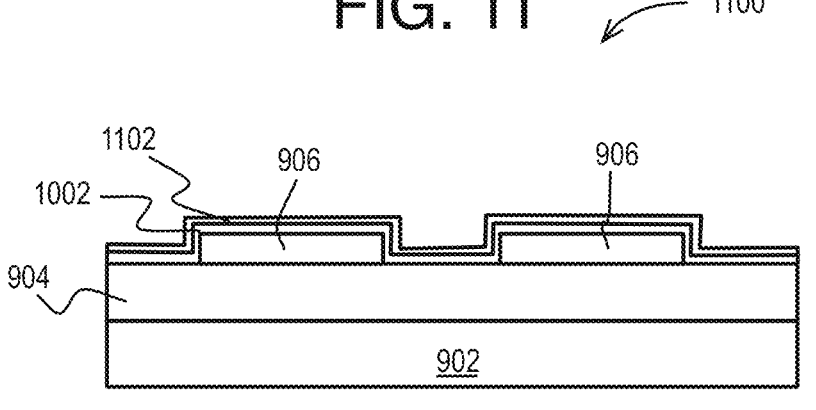

Referring to FIG. 11, at least one second stress-relieving dielectric adhesion layer 1102 is deposited over the first adhesion layer 1002, and here shown as a blanket deposition although a patterned deposition as described above could be performed instead. The second adhesion layer 1102 is formed by a shorter deposition to create a thinner layer, and here about 40-80 nm, 50-70 nm, 60-70 nm, or 60 nm thick. This thickness forms a CTE for the second dielectric layer 1102 of 6 ppm/K. This structure then establishes the difference in CTEs. The second adhesion layer 1102 also may be formed of silicon and nitride, but otherwise may have the same variations as discussed above in operation 810 (FIG. 8), or elsewhere herein.

Figure 12:
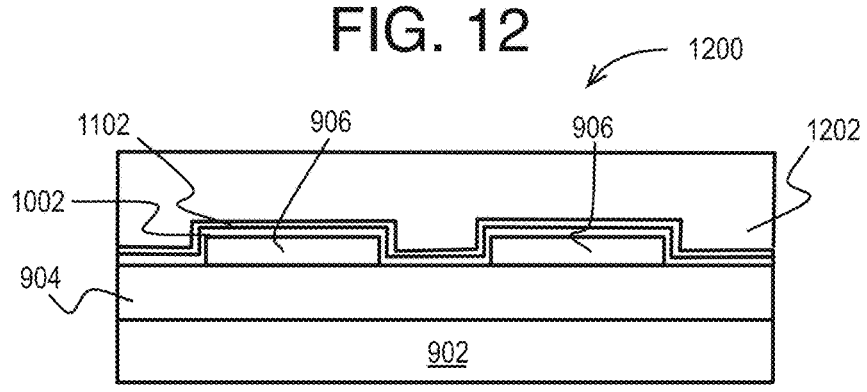

Referring to FIG. 12, a lamination operation is used to deposit dielectric layer (or material or just dielectric) 1202 over the adhesion layer 1102 in partial substrate 1200. The composition of the dielectric material (or lamination layer)

1202 is mentioned above in operation 812 (FIG. 8). The dielectric layer 1202 also may act as a protective layer to prevent or limit roughening etchant, if used on other conductive features, from damaging the adhesion layers 1002 and 1102 and the smooth conductive features 906.

In some implementations, dielectric 1202 is a single layer of dielectric (e.g., a dielectric laminate or a molded resin) having a thickness between 10 and 100 microns. In some implementations, dielectric 1202 is part of a multilayer package stack comprising multiple dielectric layers, where only one portion of the package is shown in the figure. In some implementations, dielectric 1200 may comprise multiple layers of an organic laminate, each laminate layer having thicknesses ranging between 10 and 100 microns. While dielectric layer boundaries may coincide with conductor levels, multiple layers of dielectric may be between conductor planes.

Figure 13:
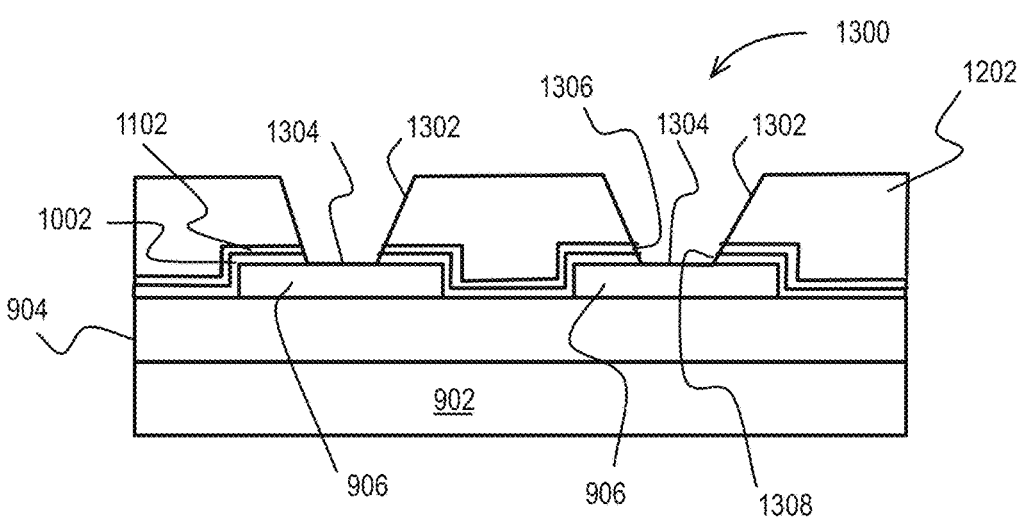

Referring to FIG. 13 for one example form here, a partial substrate 1300 shows the results of laser drilling in order to provide clear pathways to the smooth conductive features 906 for vias. In this example, conductive features 906 are, or have, landing pads for example, having thicknesses ranging between 10 and 50 microns for example. When conductive features 906 are pads, the pads may be interconnects for bonding package substrate 1400 to a semiconductor die (not shown) or could be for vias connecting to other metallization levels.

Thus, a partial substrate 1300 shows the result of laser drilling to form via holes 1302 through the dielectric layer 1202 and holes 1306 and 1308 through the thin adhesion layers 1102 and 1002, respectively. The drilling exposes a surface of the conductive features 906 within the holes 1302, 1306, and 1308. A dry or wet desmear then may be applied to clean debris from the holes 1302, 1306, and 1308.

Figure 14:
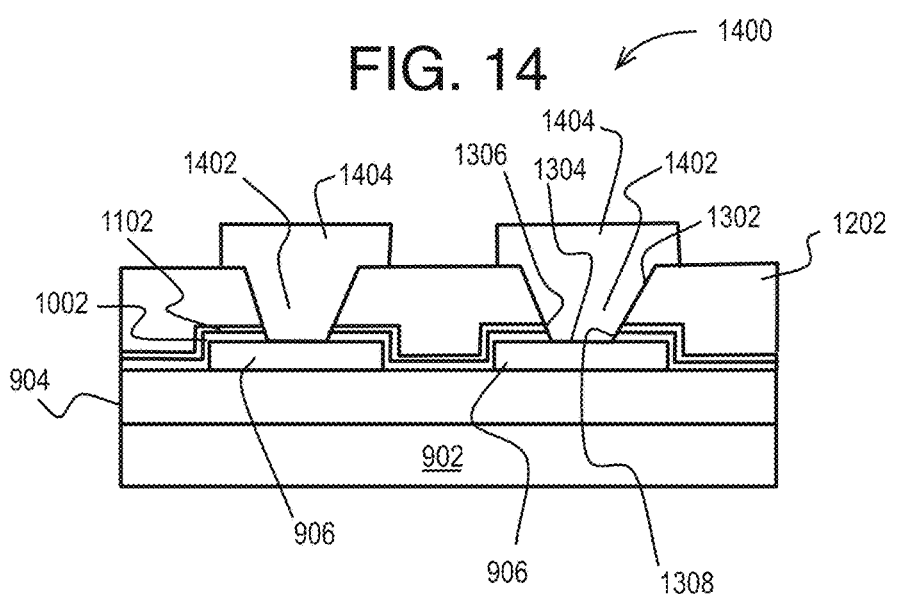

Referring to FIG. 14, a completed package substrate 1400 shows vias 1402 constructed and filling the via holes 1302 drilled in the last operations. Thus, vias 1402 are grown in openings 1302 by electroplating copper or a suitable alloy of copper. In some implementations, vias 1402 are formed by electroless deposition of copper or a suitable copper alloy. As described above, the remaining or peripheral surfaces of the adhesion layer 1202 may still form a strong adhesion interface with conductive features 906 indirectly through adhesion layers 1002 and 1102, except now with a much reduced risk of deformations due to thermal-based forces as described above. Pads 1404 may be formed over the surface of dielectric layer 1202 adjacent to vias 1402. Pads 1404 are landing pads extending laterally beyond bases of vias 1402.

Vias 1402 and associated pads 1404 are plated into openings 1302, 1306, and 1308 and over the adjacent dielectric 1202, respectively. Pads 1404 may be top-level die interconnect pads or landing pads for vias grown over pads 1404 in subsequent operations. Vias 1302 may be grown on conductive features 906 that are HSIO traces, and which may be integral with non-HSIO traces (not shown) attached to vias that extend through the base layer 902 and interconnect traces 906 to power routing to a power source (e.g., a potentiostat) for electroplating.

Referring to FIG. 15, an alternative package substrate 1500 has a conductive feature 1502, multiple dielectric adhesion layers 1506 and 1508 as described above with different CTEs, and a lamination layer 1504 being adhered to the conductive feature 1502 through the adhesion layers. In this case, however, one or more extra dielectric adhesion layers 1510 may be placed under, on, or over one or more of the adhesion layers 1506 and 1508. The extra adhesion layer 1510 may be provided solely or mainly to strengthen adhesion between layers, such as between the conductive feature 1502 and adhesion layer 1506 as shown. The extra adhesion layer may have a composition of Si, N, O, Ti, etc. The CTE of the extra adhesion layer may be considered to determine the stress equalization.

Referring to FIG. 16 as another alternative approach, an optional package substrate 1600 may have a conductive feature 1602 and a lamination layer 1604 being adhered to the conductive feature 1602 through the adhesion layers. In this case, however, more adhesion layers are added for better precise control of the CTEs and equalization of the stresses. Thus, a stack 1614 of adhesion layers 1606 and 1608 may be on the conductive feature 1602, while a stack 1616 of adhesion layers 1610 and 1612 are adjacent the lamination layer 1604. In this case, the deposition parameters, such as layer thickness, are still adjusted to modify the CTE of the layers, except now the order of the layer thicknesses can be varied within a stack 1614 or 1616 as long as the total CTEs of the two stacks 1614 or 1616 comply with the equalization algorithms mentioned above. Thus, here the stack total CTE, rather than a single layer CTE, is used in equations. So in this example, the total CTE of stack 1614 can be 3 ppm/K and the total CTE of stack 1616 can be 6 ppm/K when the conductive feature 1602 has a CTE of 17 ppm/K and the lamination layer 1604 has a CTE of 20 ppm/K as described above with substrate 200 (FIG. 12). The other algorithms apply as well where the total stack CTEs should have the same difference as the CTEs of conductive feature and lamination layer, and the difference between the CTEs of the conductive feature and the closest stack to the conductive feature should be the same or substantially the same as the difference of the CTEs of the lamination layer and the stack closest to the lamination layer. Within these algorithms then, it does not matter if the adhesion layers in a single stack are different or the same, or which adhesion layer is thicker (bottom, top, middle, etc. of the stack). While both stacks 1614 and 1616 are shown with two adhesion layers each. Each stack may have more than two adhesion layers, and the two stacks do not always need to have the same number of stress-relieving adhesion layers. The variations of the other parameters (composition, microstructure, and/or density) may be varied or otherwise used as described above with the other examples to tune the CTE of the adhesion layers.

Figure 17:
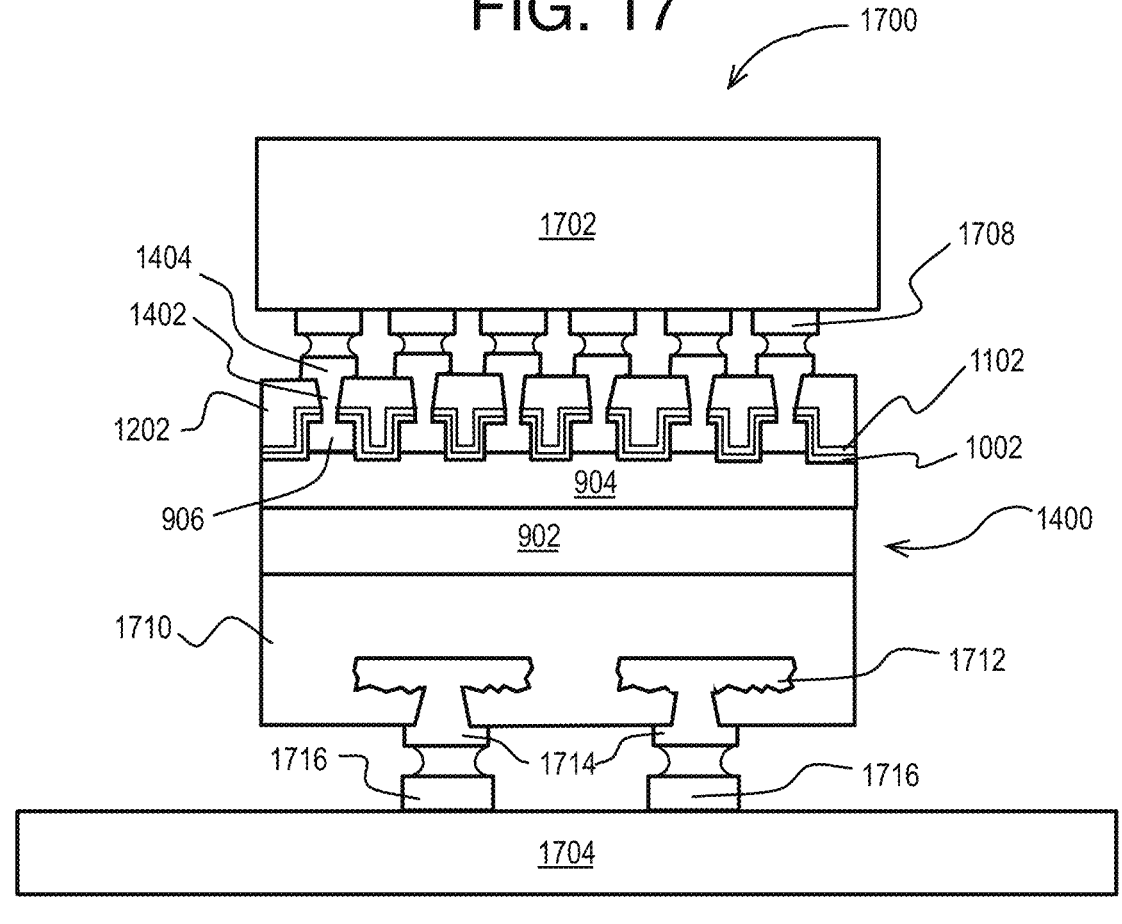
FIG. 17 is a schematic diagram of a cross-sectional view in the x-z plane of an implementation of a package substrate within an IC package according to at least one of the implementations of the disclosure.

Referring to FIG. 17, an IC package 1700 is shown with a cross-sectional view in the x-z plane of an implementation of package substrate 1400 (FIG. 14) or 200 (FIG. 2), according to some implementations of the disclosure. In this example, package 1700 has an implementation of substrate 1400 stacked on a frontside of the package 1700 for interconnection to, and support of, a semiconductor die 1702. In this case, the base layer 902 of the substrate 1400 is a center or middle board that also has a backside for interconnection to a printed circuit board (PCB) 1704.

Specifically, an implementation of package substrate 1400 comprises a number of conductive features 906 on dielectric layer 904 and under multiple adhesion layers 1002 and 1102 arranged to reduce or cancel thermal-based forces by tuning the CTEs of the adhesion layer 1002 and 1102. The lamination layer 1202 as well as vias 1402 and caps 1404 are placed over the adhesion layers 1002 and 1102 as described above.

The substrate 1400 is shown assembled into package 1700, and comprising die 1702 bonded to package substrate 1400. Interconnect via pads 1404 (which may be non-HSIO or HSIO) are shown on the frontside and top of package substrate 1400 (and shown bonded to die pads 1708) to convey data signals from HSIO traces and pads 906 to die 1702. Package 1700 also may be bonded to printed circuit board (PCB) 1704 through non-HSIO land pads 1714 at a bottom or backside metallization level of the substrate 1400. Land pads 1714 may be solder bonded to interconnects 1716 on a top plane of the PCB 1704 in this example as shown. The non-HSIO land pads 1714 may be part of power routing from the PCB 1704 that provides power to die 1702 through via stacks that are not shown in this cross-section of substrate 1400. In some implementations, package substrate 1400 comprises a core 902. In some implementations, power planes on opposite sides of the package core 902 may be interconnected by through-vias and/or copper plug inserts extending through the core (also not shown).

The package 1700 also provides dielectric layer 1710 to embed the backside conductors 1712. By one form, these are non-HSIO conductors 1712 may be formed of a metal (e.g., copper), and may be roughened by known methods. All or parts of the surfaces of the conductors 1712 may be roughened including top surfaces and sidewalls of traces and pads. Cross sections of electroplated conductive features may be substantially rectangular or trapezoidal, as conductive features may be plated into patterned openings in a photoresist plating mask or blanket-plated over the package dielectric and then patterned by a wet etch through a photoresist etch mask. Otherwise, one or more conductors on any side of the substrate may be covered by multiple adhesion layers as described herein, or all planar conductors, such as traces and pads, may be covered. Many variations are contemplated.

Figure 18:
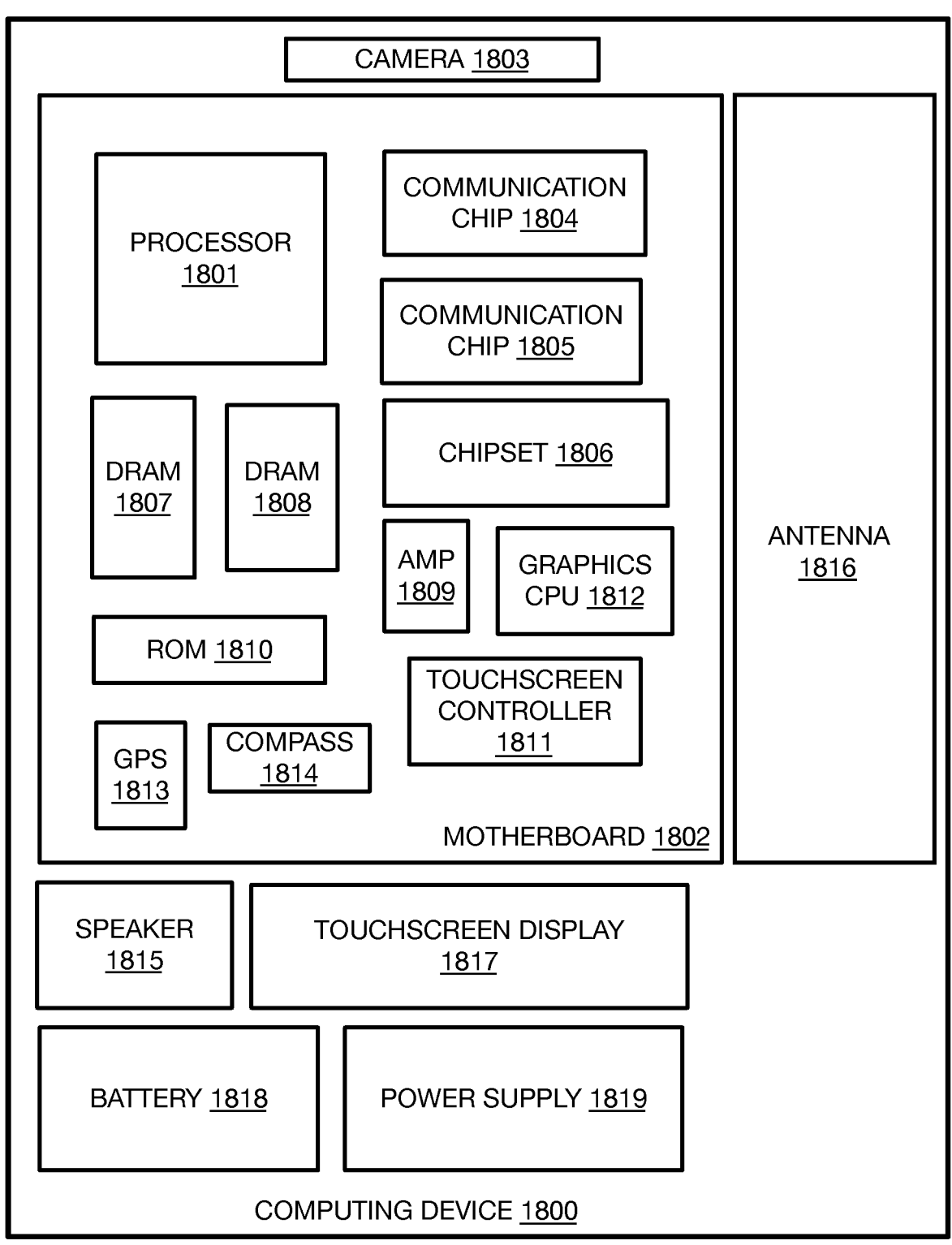
FIG. 18 is a functional schematic diagram of a computing device, all arranged in accordance with at least some implementations of the present disclosure.

Referring to FIG. 18, a computing device 1800 is arranged in accordance with at least some implementations of the present disclosure. Computing device 1800 may have any of the microelectronic assemblies found above including substrates 200 and 1400, and/or IC package 1700, for example, and further includes a motherboard 1802 hosting a number of components, such as but not limited to a processor 1801 (e.g., an applications processor) and one or more communications chips 1804, 1805. Processor 1801 may be physically and/or electrically coupled to the motherboard 1802. In some examples, processor 1801 includes an integrated circuit die packaged within the processor 1801 and as described herein. In general, the term "processor" may refer to any device or portion of a device that processes electronic data from registers and/or memory to transform that electronic data into other electronic data that may be stored in registers and/or memory. Any one or more device or component of computing device 1800 may include a die or device having substrates with multiple layer adhesion and stress-relief by CTE control as discussed herein. In various examples, the one or more communication chips 1804, 1805 also may be physically and/or electrically coupled to the motherboard 1802. In further implementations, communication chips 1804 and 1805 may be part of processor 1801. Depending on its applications, computing device 1800 may include other components that may or may not be physically and electrically coupled to motherboard 1802. These other components may include, but are not limited to, volatile memory (e.g., DRAM) 1807, 1808, non-volatile memory (e.g., ROM) 1810, a graphics processor 1812, global positioning system (GPS) device 1813, compass 1814, a chipset 1806, an antenna 1816, a power amplifier 1809, a touch-screen controller 1811, a touchscreen display 1817, a speaker 1815, a camera 1803, a battery 1818, and a power supply 1819, as illustrated, and other components such as a digital signal processor, a crypto processor, an audio codec, a video codec, an accelerometer, a gyroscope, flash memory, and a mass storage device (such as hard disk drive, solid state drive (SSD), compact disk (CD), digital versatile disk (DVD), and so forth), or the like.

Communication chips 1804, 1805 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some implementations they might not. Communication chips 1804, 1805 may implement any of a number of wireless standards or protocols, including but not limited to those described elsewhere herein, if any. The communication chips 1804, 1805 may include a first communication chip that may be dedicated to shorter range wireless communications such as Wi-Fi and Bluetooth and a second communication chip dedicated to longer range wireless communications such as GPS, EDGE, GPRS, CDMA, WiMAX, LTE, Ev-DO, and others. Furthermore, power supply 1819 may convert a source power from a source voltage to one or more voltages employed by other devices of mobile computing platform 1100. In some implementations, power supply 1819 converts an AC power to DC power. In some implementations, power supply 1819 converts a DC power to DC power at one or more different (lower) voltages. In some implementations, multiple power supplies are staged to convert from AC to DC and then from DC at a higher voltage to DC at a lower voltage as specified by components of computing device 1800.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It is understood that the subject matter of the present description is not necessarily limited to specific applications illustrated in FIGS. 1-18. The subject matter may be applied to other microelectronic devices and assembly applications, as well as any appropriate electronic application, as will be understood to those skilled in the art.

The following examples pertain to further implementations. Specifics in the examples may be used anywhere in one or more implementations.

In example 1, an electronic device package comprises a package substrate with a first surface; a conductive feature over the first surface and arranged to couple to an integrated circuit die; a first dielectric layer on the conductive feature, the first dielectric layer having a first thickness and comprising silicon and nitrogen; a second dielectric layer over the first dielectric layer and having a second thickness different than the first thickness and comprising silicon and nitrogen; and a third dielectric layer over the second dielectric layer and comprising an organic material.

In example 2, the subject matter of example 1 wherein the thicker of the first and second dielectric layer is in contact with whichever of the conductive feature and the third dielectric layer has a lower coefficient of thermal expansion (CTE).

In example 3, the subject matter of example 1 or 2 wherein the conductive feature comprises Cu; and the first thickness is greater than the second thickness.

In example 4, the subject matter of any one of examples 1 to 3 wherein the first dielectric layer has a first average grain size, and the second dielectric layer has a second average grain size, less than the first average grain size.

In example 5, the subject matter of any one of examples 1 to 4 wherein the first and second dielectric layers have substantially the same composition.

In example 6, the subject matter of any one of examples 1 to 5 wherein the first and second dielectric layers have a thickness in a range of 50 to 350 nm.

In example 7, the subject matter of any one of examples 1 to 5 wherein the first dielectric layer has a thickness of 40 to 80 nm, while the second dielectric layer has a thickness of 250 to 350 nm.

In example 8, the subject matter of any one of examples 1 to 7 wherein the first dielectric layer has a different height of amorphous nanocolumnars than the second dielectric layer sufficient to cause a difference in coefficient of thermal expansion.

In example 9, the subject matter of any one of examples 1 to 7 wherein at least a portion of the first dielectric layer proximal to the second dielectric layer has a columnar microstructure.

In example 10, the subject matter of example 9 wherein the second dielectric layer is substantially amorphous.

In example 11, a method of fabricating an electronic package substrate, comprising: receiving a package substrate with at least one conductive feature on a top surface; depositing a first dielectric layer on the conductive feature and having a composition of silicon and nitrogen and having a first thickness; depositing a second dielectric layer with the same composition as the first dielectric layer and having a second thickness different than the first thickness; and laminating an organic material layer on the second dielectric layer.

In example 12, the subject matter of example 11 wherein the method comprises performing a cooling operation or surface activation operation at the first dielectric layer and in between the forming of the first and second dielectric layers.

In example 13, the subject matter of example 11 or 12 wherein the method comprises generating the first and second dielectric layers with coefficients of thermal expansion depending on the coefficients of thermal expansion of the conductive feature and third dielectric layer.

In example 14, an electronic system comprises an integrated circuit die; a board; and at least one electronic substrate on the board, comprises a conductive feature over a first surface of a package substrate and under the integrated circuit die; a first dielectric layer on the conductive feature, the first dielectric layer having a first thickness and comprising silicon and nitrogen; a second dielectric layer over the first dielectric layer and having a second thickness different than the first thickness and comprising silicon and nitrogen; and a third dielectric layer over the second dielectric layer and comprising an organic material.

In example 15, the subject matter of example 14 wherein the first dielectric layer has a thickness five times greater than a thickness of the second dielectric layer, and wherein the first dielectric layer has a CTE two times smaller than a CTE of the second dielectric layer.

In example 16, the subject matter of example 14 or 15 wherein the first and second dielectric layers have at least one of: (1) different compositions of $SiN_x$ and (2) different compositions among $SiN_x$, $SiO_2$, $SiO_xN_y$, and TiN.

In example 17, the subject matter of any one of examples 14 to 16 wherein the first and second dielectric layers have different microstructures among amorphous nanocolumnar and crystalline.

In example 18, the subject matter of any one of examples 14 to 17 wherein the first thickness is larger than the second thickness by an amount that depends on the difference between the CTE of the conductive feature and the CTE of the third dielectric layer.

In example 19, the subject matter of any one of examples 14 to 18 wherein CTEs of both the first and second dielectric layers are either both smaller or both larger than the CTEs of the conductive feature and the third dielectric layer.

In example 20, the subject matter of any one of examples 14 to 19 wherein a difference in CTEs of the first and second dielectric layer is the same as the difference of CTEs of the conductive feature and the third dielectric layer.

In example 21, the subject matter of any one of examples 14 to 20 wherein a difference between CTEs of the conductive feature and the first dielectric layer is the same as a difference of CTEs of the second and third dielectric layers.

In example 22, the subject matter of any one of examples 14 to 21 wherein the first and second dielectric layers have CTEs in a range of 2 to 6 ppm/K.

In example 23, the subject matter of any one of examples 14 to 21 wherein the first dielectric layer has a CTE of 2-4 ppm/K and the second dielectric layer has a CTE of 5-7 ppm/K.

In example 24, the subject matter of any one of examples 14 to 23 wherein the first and second dielectric layers have a difference of coefficient of thermal expansion (CTE) of 3 ppm/K, and wherein the conductive feature and third dielectric have a difference of coefficient of thermal expansion (CTE) of 3 ppm/K.

In example 25, the subject matter of any one of examples 14 to 24 wherein the system comprises one or more fourth dielectric layers placed under, on, or between the first and second dielectric layers and having a composition, thickness, or microstructure different than the first and second dielectric layers.

In example 26, a device, apparatus, or system includes means to perform a method according to any one of the above implementations.

In example 27, at least one machine readable medium includes a plurality of instructions that in response to being executed on a computing device, cause the computing device to perform a method according to any one of the above implementations.

It will be recognized that the disclosures herein are not limited to the implementations so described, but can be practiced with modification and alteration without departing from the scope of the appended claims. For example, the above implementations may include specific combination of features. However, the above implementations are not limited in this regard and, in various implementations, the above implementations may include undertaking only a subset of such features, undertaking a different order of such features, undertaking a different combination of such features, and/or undertaking additional features than those features explicitly listed. The scope of the assemblies, devices, and methods disclosed herein should, therefore, be determined with reference to the appended claims, along with the full scope of equivalents to which such claims are entitled.

The invention claimed is:

1. A device, comprising:

a package substrate with a first surface;

a conductive feature over the first surface and arranged to couple to an integrated circuit die;

a first dielectric layer on the conductive feature, the first dielectric layer having a first thickness and comprising silicon and nitrogen;

a second dielectric layer over the first dielectric layer, the second dielectric layer having a second thickness different than the first thickness and comprising silicon and nitrogen; and a third dielectric layer over the second dielectric layer and comprising an organic material, wherein the thicker of the first dielectric layer and the second dielectric layer is in contact with whichever of the conductive feature and the third dielectric layer has a lower coefficient of thermal expansion (CTE).

2. The device of claim 1, wherein the first thickness is not less than 250 nm and the second thickness is not more than 70 nm.

3. The device of claim 1, wherein at least a portion of the first dielectric layer proximal to the second dielectric layer has a columnar microstructure, and wherein the second dielectric layer is substantially amorphous.

4. The device of claim 1, wherein the first dielectric layer and the second dielectric layer have at least one of: (1) different compositions of $SiN_x$ and (2) different compositions among $SiN_x$, $SiO_2$, $SiO_xN_y$, and TiN.

5. The device of claim 1, wherein a difference in CTEs between the first dielectric layer and the second dielectric layer is substantially the same as a difference in CTEs between the conductive feature and the third dielectric layer.

6. The device of claim 1, wherein the first dielectric layer and the second dielectric layer have CTEs in a range of 2 to 6 ppm/K.

7. The device of claim 1, further comprising one or more fourth dielectric layers placed under, on, or between the first dielectric layer and the second dielectric layer and having a composition, thickness, or microstructure different than the first dielectric layer and the second dielectric layer.

8. The device of claim 1, further comprising:
a board coupled to the package substrate.

9. A device, comprising:
a package substrate with a first surface;
a conductive feature over the first surface and arranged to couple to an integrated circuit die;
a first dielectric layer on the conductive feature, the first dielectric layer having a first thickness and comprising silicon and nitrogen;
a second dielectric layer over the first dielectric layer, the second dielectric layer having a second thickness different than the first thickness and comprising silicon and nitrogen; and
a third dielectric layer over the second dielectric layer and comprising an organic material, wherein the first dielectric layer has a coefficient of thermal expansion (CTE) of 2-4 ppm/K and the second dielectric layer has a CTE of 5-7 ppm/K.

10. The device of claim 9, wherein the first thickness is not less than 250 nm and the second thickness is not more than 70 nm.

11. The device of claim 9, wherein at least a portion of the first dielectric layer proximal to the second dielectric layer has a columnar microstructure, and wherein the second dielectric layer is substantially amorphous.

12. The device of claim 9, wherein the first dielectric layer and the second dielectric layer have at least one of: (1) different compositions of $SiN_x$ and (2) different compositions among $SiN_x$, $SiO_2$, $SiO_xN_y$, and TiN.

13. The device of claim 9, wherein CTEs of both the first dielectric layer and the second dielectric layer are either both smaller or both larger than the CTEs of the conductive feature and the third dielectric layer.

14. The device of claim 9, further comprising one or more fourth dielectric layers placed under, on, or between the first dielectric layer and the second dielectric layer and having a composition, thickness, or microstructure different than the first dielectric layer and the second dielectric layer.

15. The device of claim 9, further comprising:
a board coupled to the package substrate.

16. A device, comprising:
a package substrate with a first surface;
a conductive feature over the first surface and arranged to couple to an integrated circuit die;
a first dielectric layer on the conductive feature, the first dielectric layer having a first thickness and comprising silicon and nitrogen;
a second dielectric layer over the first dielectric layer, the second dielectric layer having a second thickness different than the first thickness and comprising silicon and nitrogen; and
a third dielectric layer over the second dielectric layer and comprising an organic material, wherein the first dielectric layer has a first average grain size and the second dielectric layer has a second average grain size less than the first average grain size.

17. The device of claim 16, wherein the first thickness is not less than 250 nm and the second thickness is not more than 70 nm.

18. The device of claim 16, wherein the first dielectric layer and the second dielectric layer have at least one of: (1) different compositions of $SiN_x$ and (2) different compositions among $SiN_x$, $SiO_2$, $SiO_xN_y$, and TiN.

19. The device of claim 16, wherein the first dielectric layer and the second dielectric layer have coefficients of thermal expansion (CTEs) in a range of 2 to 6 ppm/K.

20. The device of claim 16, further comprising one or more fourth dielectric layers placed under, on, or between the first dielectric layer and the second dielectric layer and having a composition, thickness, or microstructure different than the first dielectric layer and the second dielectric layer.

21. The device of claim 16, further comprising:
a board coupled to the package substrate.

22. A device, comprising:
a package substrate with a first surface;
a conductive feature over the first surface and arranged to couple to an integrated circuit die;
a first dielectric layer on the conductive feature, the first dielectric layer having a first thickness and comprising silicon and nitrogen;
a second dielectric layer over the first dielectric layer, the second dielectric layer having a second thickness different than the first thickness and comprising silicon and nitrogen; and
a third dielectric layer over the second dielectric layer and comprising an organic material, wherein the first dielectric layer and the second dielectric layer have different microstructures among amorphous nanocolumnar and crystalline.

23. The device of claim 22, wherein the first thickness is not less than 250 nm and the second thickness is not more than 70 nm.

24. The device of claim 22, wherein the first dielectric layer and the second dielectric layer have at least one of: (1) different compositions of $SiN_x$ and (2) different compositions among $SiN_x$, $SiO_2$, $SiO_xN_y$, and TiN.

25. The device of claim 22, wherein the first dielectric layer and the second dielectric layer have coefficients of thermal expansion (CTEs) in a range of 2 to 6 ppm/K.

26. The device of claim 22, further comprising one or more fourth dielectric layers placed under, on, or between the first dielectric layer and the second dielectric layer and having a composition, thickness, or microstructure different than the first dielectric layer and the second dielectric layer.

27. The device of claim 16, further comprising:

a board coupled to the package substrate.

\* \* \* \* \*